US012646560B2

(12) United States Patent
Lin

(10) Patent No.: US 12,646,560 B2
(45) Date of Patent: Jun. 2, 2026

(54) DATA VERIFICATION DEVICE AND DATA VERIFICATION METHOD

(71) Applicant: NANYA TECHNOLOGY CORPORATION, New Taipei city (TW)

(72) Inventor: Shih-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 221 days.

(21) Appl. No.: 18/624,867

(22) Filed: Apr. 2, 2024

(65) Prior Publication Data

US 2025/0308578 A1     Oct. 2, 2025

(51) Int. Cl.
*G11C 11/4096* (2006.01)
*G11C 11/4078* (2006.01)

(52) U.S. Cl.
CPC ...... *G11C 11/4096* (2013.01); *G11C 11/4078* (2013.01)

(58) Field of Classification Search
CPC ............. G11C 11/4096; G11C 11/4078; G06F 3/0604; G06F 3/0638; G06F 3/0679
USPC ...................................................... 365/185.22
See application file for complete search history.

(56) References Cited

FOREIGN PATENT DOCUMENTS

JP          H11250198 A  *  9/1999

* cited by examiner

*Primary Examiner* — Huan Hoang
(74) *Attorney, Agent, or Firm* — CKC & Partners Co., LLC

(57)          ABSTRACT

A data verification device includes a processor. The processor is configured to perform following steps: writing a first high frequency sequence data to a memory to obtain a first voltage value; writing a second high frequency sequence data to the memory to obtain a second voltage value; comparing the first voltage value and the second voltage value to obtain a first maximum voltage value; and outputting the first maximum voltage value. The first high frequency sequence data includes a first sub data having a first logic value of 0101.

16 Claims, 5 Drawing Sheets

700

100

DA

| Mode | Data | |
|---|---|---|
| High frequency topo | 0101010101010101 | S1 |
| | 1010101010101010 | S2 |
| Low frequency topo | 0000111100001111 | S3 |
| | 0000000011111111 | S4 |
| Hybrid frequency topo | 0000111101010101 | S5 |

| writing a first high frequency sequence data to a memory to obtain a first voltage value | 710 |
| writing a second high frequency sequence data to the memory to obtain a second voltage value | 720 |
| comparing the first voltage value and the second voltage value to obtain a first maximum voltage value | 730 |
| outputting the first maximum voltage value | 740 |

DATA VERIFICATION DEVICE AND DATA VERIFICATION METHOD

BACKGROUND

Field of Invention

The present invention relates to a verification device and verification method. More particularly, the present invention relates to a data verification device and data verification method.

Description of Related Art

On difference high speed platform, as area of Dynamic random access memory (DRAM) getting smaller, as speed of DRAM getting more faster, the internal signal path with combination variation and the receiver recognized the correct data is more important for DRAM.

SUMMARY

The present disclosure provides a data verification device. The data verification device includes a processor. The processor is configured to perform following steps: writing a first high frequency sequence data to a memory to obtain a first voltage value; writing a second high frequency sequence data to the memory to obtain a second voltage value; comparing the first voltage value and the second voltage value to obtain a first maximum voltage value; and outputting the first maximum voltage value. The first high frequency sequence data includes a first sub data having a first logic value of 0101.

The present disclosure provides a data verification method. The data verification method includes the following steps: writing a first high frequency sequence data to a memory to obtain a first voltage value; writing a second high frequency sequence data to the memory to obtain a second voltage value; comparing the first voltage value and the second voltage value to obtain a first maximum voltage value; and outputting the first maximum voltage value.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2 is a schematic diagram of data verification device of data according to one embodiment of the present disclosure.

DETAILED DESCRIPTION

Figure 1:
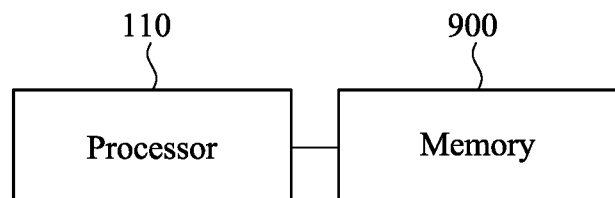
FIG. 1 is a block diagram of a data verification device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

Various embodiments of the present technology are discussed in detail below with figures. It should be understood that the details should not limit the present disclosure. In other words, in some embodiments of the present disclosure, the details are not necessary. In addition, for simplification of figures, some known and commonly used structures and elements are illustrated simply in figures.

In the present disclosure, "connected" or "coupled" may refer to "electrically connected" or "electrically coupled." "Connected" or "coupled" may also refer to operations or actions between two or more elements.

FIG. 1 is a block diagram of a data verification device according to one embodiment of the present disclosure. As shown in FIG. 1, in some embodiments, the data verification device 100 includes a processor 110 and a memory 900. The processor 110 is coupled to the memory 900.

For example, the processor 110 can be a Central Processing Unit (CPU), the memory 900 can be a dynamic random access memory (DRAM), such as a DDR3 DRAM, a DDR4 DRAM, or a DDR5 DRAM, but the present disclosure is not limited to this embodiment.

FIG. 2 is a schematic diagram of data verification device of data according to one embodiment of the present disclosure. As shown in FIG. 2, in some embodiments, a high frequency topo signal includes a plurality of data S1 and S2.

For example, the data S1 can be "0101010101010101", the data S2 can be "1010101010101010", but the present disclosure is not limited to this embodiment.

In some embodiments, in the high frequency topo signal, the bit is reverse forward bit or next bit.

For example, in the data S1 or S2, next to "1" can be "0", or next to "0" can be "1", but the present disclosure is not limited to this embodiment.

In some embodiments, in the data S1, a number of "1" can be 8. In some embodiments, in the data S1, a number of "0" can be 8. In some embodiments, in the data S2, a number of "1" can be 8. In some embodiments, in the data S2, a number of "0" can be 8.

In some embodiments, a low frequency topo signal includes a plurality of data S3 and S4.

For example, the data S3 can be "0000111100001111", the data S4 can be "0000000011111111", but the present disclosure is not limited to this embodiment.

In some embodiments, in the low frequency topo signal, the bit is same as forward bit or next bit.

For example, in the data S3 or S4, next to "1" can be "1", or next to "0" can be "0", but the present disclosure is not limited to this embodiment.

Besides, in the data S3 or S4, next to "1" can be "0", or next to "0" can be "1", but the present disclosure is not limited to this embodiment.

In some embodiments, in the data S3 or S4, next to "00001111" can be "00001111", or next to "00000000" can be "11111111", but the present disclosure is not limited to this embodiment. In some embodiments, in the data S3 or S4, next to "11110000" can be "11110000", or next to "11111111" can be "00000000", but the present disclosure is not limited to this embodiment.

In some embodiments, a hybrid frequency topo signal includes a data S5.

For example, the data S5 can be "0000111101010101", but the present disclosure is not limited to this embodiment.

In some embodiments, the hybrid frequency topo signal can simultaneously have the characteristics of the high frequency topo signal and the characteristics of the low frequency topo signal.

In some embodiments, the hybrid frequency topo signal can simultaneously have a part of the characteristics of the data S1 and a part of the characteristics of the data S3. In some embodiments, the hybrid frequency topo signal can simultaneously have a part of the characteristics of the data S2 and a part of the characteristics of the data S4.

In some embodiments, as the bandwidth and speed of DRAM getting more faster, the more importance of RX test. So JEDEC definition some Decision Feedback Equalization (DFE) MRS options to use for help DDR5 Receiver performance.

In some embodiments, DDR5 write performance distinguished is needed for input signal design by different vendor, the different DFE strength design will influence input signal recognized, we use the unique topo sequence methodology to check write performance by DFE impact and confirm DFE strength design and signal integrity.

Figure 3:
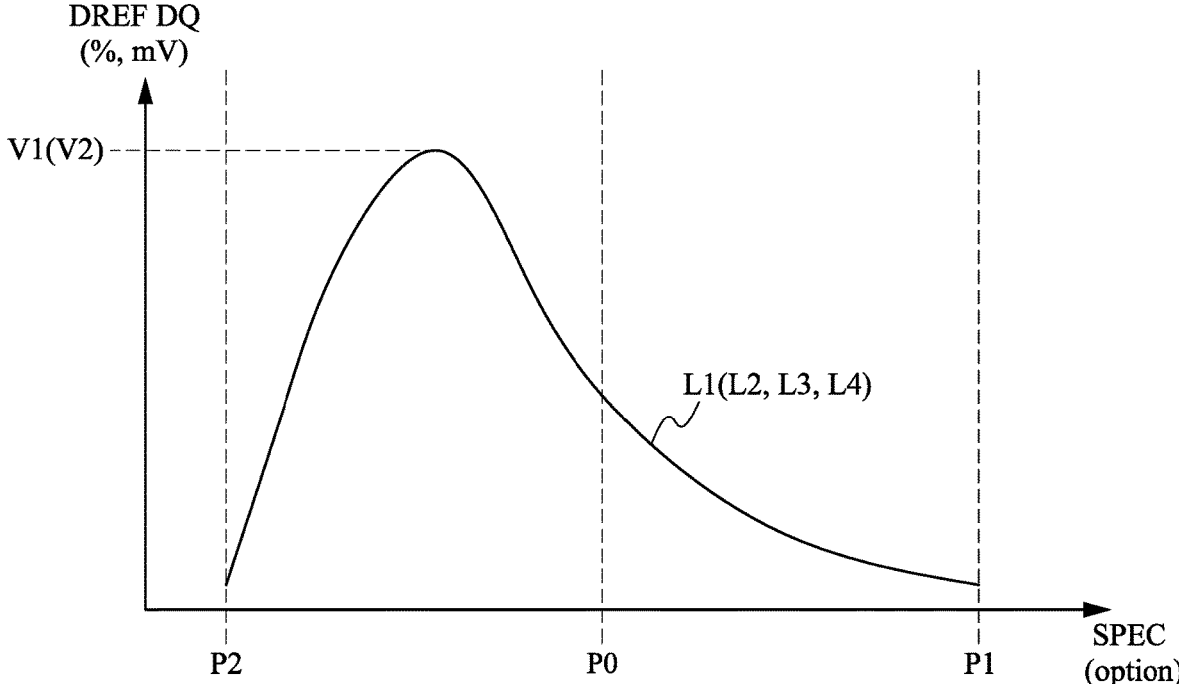
FIG. 3 is a schematic diagram of data verification device of data according to one embodiment of the present disclosure.

FIG. 3 is a schematic diagram of data verification device of data according to one embodiment of the present disclosure. As shown in FIG. 3, in some embodiments, a coordinate diagram includes a DREF DQ data, a SPEC data and a curve L1, L2, L3, or L4. The curve L1 can correspond to a voltage V1. The curve L1 can correspond to a plurality value P0, P1, and P2.

For example, a step of the DREF DQ data can be 5.5 mV, the voltage V1 can be 33 mV, the value P0 can be 0, the value P1 can be +40, the value P2 can be −40, but the present disclosure is not limited to this embodiment.

In some embodiments, the curve L1 can be related to the hybrid frequency topo signal. In some embodiments, the curve L1 can have a plurality of points, the point can be the data S1 or S2. In some embodiments, the curve L1 can correspond to the voltage V1, and the voltage V1 can be a maximum voltage.

In some embodiments, the curve L2 can be related to the low frequency topo signal. In some embodiments, the curve L2 can have the plurality of points, and the point can be the data S3 or S4. In some embodiments, the curve L2 can correspond to the voltage V2, and the voltage V2 can be the maximum voltage.

In some embodiments, the curve L3 can be related to the hybrid frequency topo signal. In some embodiments, the curve L3 can have a plurality of points, and the point can be the data S5.

In some embodiments, the curve L4 can be related to other frequency topo signal. The other frequency topo signal can be different from the high frequency topo signal, the low frequency topo signal, and the hybrid frequency topo signal.

Please refer to FIG. 1 to FIG. 3, in some embodiments, the processor 110 is configured to perform following steps: writing a first high frequency sequence data to a memory 900 to obtain a first voltage value.

For example, the first high frequency sequence data can correspond to the data S1 in FIG. 3, the first voltage value can be smaller than or equal to the voltage V1 in FIG. 3, but the present disclosure is not limited to this embodiment.

Then, writing a second high frequency sequence data to the memory to obtain a second voltage value.

For example, the second high frequency sequence data can correspond to the data S2 in FIG. 3, the second voltage value can be smaller than or equal to the voltage V1 in FIG. 3, but the present disclosure is not limited to this embodiment.

Next, comparing the first voltage value and the second voltage value to obtain a first maximum voltage value.

For example, the second voltage value can be the voltage V1 in FIG. 3, the first voltage value can be smaller than the voltage V1 in FIG. 3, the first maximum voltage value can be the voltage V1 in FIG. 3, but the present disclosure is not limited to this embodiment.

Then, outputting the first maximum voltage value.

For example, the processor 110 can output the first maximum voltage value (such as the voltage V1) as a form, but the present disclosure is not limited to this embodiment.

In some embodiments, the first high frequency sequence data comprise a first sub data having a first logic value of 0101.

For example, the first high frequency sequence data can be "0101010101010101", the first sub data can be "0101", but the present disclosure is not limited to this embodiment.

In some embodiments, the second high frequency sequence data comprise a second sub data having a second logic value of 1010.

For example, the first high frequency sequence data can be "1010101010101010", the second sub data can be "1010", but the present disclosure is not limited to this embodiment.

In some embodiments, the processor 110 further performs the following steps: writing a first low frequency sequence data to a memory 900 to obtain a third voltage value.

For example, the first low frequency sequence data can correspond to the data S3 in FIG. 3, the third voltage value can be smaller than or equal to the voltage V2 in FIG. 3, but the present disclosure is not limited to this embodiment.

In some embodiments, the processor 110 further performs the following steps: writing a second low frequency sequence data to the memory 900 to obtain a fourth voltage value.

For example, the second low frequency sequence data can correspond to the data S4 in FIG. 3, the fourth voltage value can be smaller than or equal to the voltage V2 in FIG. 3, but the present disclosure is not limited to this embodiment.

In some embodiments, the processor 110 further performs the following steps: comparing the third voltage value and the fourth voltage value to obtain a second maximum voltage value.

For example, the fourth voltage value can be the voltage V4 in FIG. 3, the third voltage value can be smaller than the voltage V2 in FIG. 3, the second maximum voltage value can be the voltage V2 in FIG. 3, but the present disclosure is not limited to this embodiment.

In some embodiments, the processor 110 further performs the following steps: outputting the second maximum voltage value.

For example, the processor 110 can output the second maximum voltage value (such as the voltage V2) as the form, but the present disclosure is not limited to this embodiment.

In some embodiments, the first low frequency sequence data comprise a third sub data having a third logic value of 0111.

For example, the first low frequency sequence data can be "0000111100001111", the third sub data can be "0111", but the present disclosure is not limited to this embodiment.

In some embodiments, the second low frequency sequence data comprises a fourth sub data having a fourth logic value of 0001.

For example, the second low frequency sequence data can be "0000000011111111", the fourth sub data can be "0001", but the present disclosure is not limited to this embodiment.

In some embodiments, a first sequence number of the first high frequency sequence data is 16.

For example, a number of "1" and "0" of the first high frequency sequence data can be 16, but the present disclosure is not limited to this embodiment.

In some embodiments, a second sequence number of the first high frequency sequence data is 16.

For example, a number of "1" and "0" of the second high frequency sequence data can be 16, but the present disclosure is not limited to this embodiment.

Figure 4:
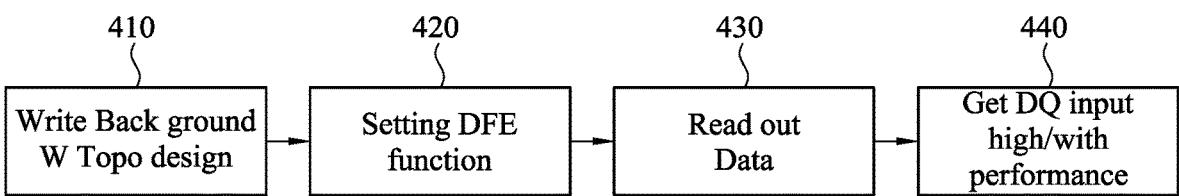
FIG. 4 is a flow chart of steps of a data verification method according to one embodiment of the present disclosure.

FIG. 4 is a flow chart of steps of a data verification method according to one embodiment of the present disclosure. As shown in FIG. 4, in some embodiments, the data verification method 400 includes a plurality of steps 410 to 440.

Please refer to FIG. 1 and FIG. 4, in some embodiments, in step 410, the processor 110 can write a design of the data S1 to S5 of FIG. 2, but the present disclosure is not limited to this embodiment.

In step 420, the processor 110 can set a function of DFE, but the present disclosure is not limited to this embodiment.

In step 430, the processor 110 can read out the data S1 to S5 of FIG. 2, but the present disclosure is not limited to this embodiment.

In step 440, the processor 110 can get a performance which is related to one of the data S1 to S5, but the present disclosure is not limited to this embodiment.

Figure 5:
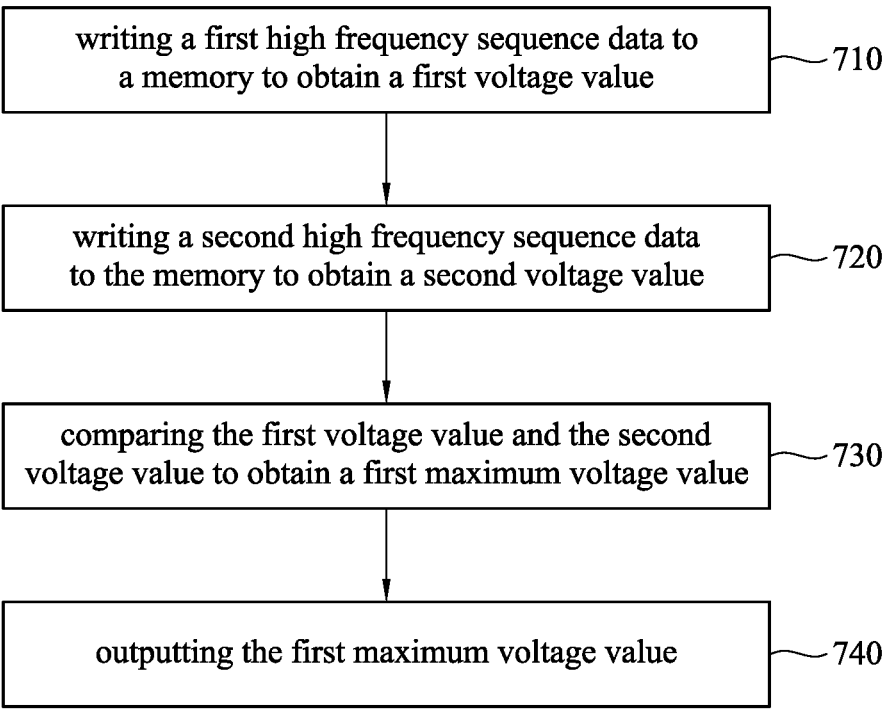
FIG. 5 is a flow chart of steps of a data verification method according to one embodiment of the present disclosure.

FIG. 5 is a flow chart of steps of a data verification method according to one embodiment of the present disclosure. As shown in FIG. 5, in some embodiments, in some embodiments, the data verification method 700 includes a plurality of steps 710 to 740.

In step 710, writing a first high frequency sequence data to a memory to obtain a first voltage value.

Please refer to FIG. 1 to FIG. 5, the processor 110 can write the first high frequency sequence data to the memory 900 to obtain the first voltage value. For example, the operations of the data verification method 700 are similar to the operations of the data verification device 100 of FIG. 1, and the descriptions regarding the other operations of the data verification method 700 will be omitted herein for the sake of brevity.

In step 720, writing a second high frequency sequence data to the memory to obtain a second voltage value.

Please refer to FIG. 1 to FIG. 5, the processor 110 can write the second high frequency sequence data to the memory 900 to obtain the second voltage value. For example, the operations of the data verification method 700 are similar to the operations of the data verification device 100 of FIG. 1, and the descriptions regarding the other operations of the data verification method 700 will be omitted herein for the sake of brevity.

In step 730, comparing the first voltage value and the second voltage value to obtain a first maximum voltage value.

Please refer to FIG. 1 to FIG. 5, the processor 110 can compare the first voltage value and the second voltage value to obtain the first maximum voltage value. For example, the operations of the data verification method 700 are similar to the operations of the data verification device 100 of FIG. 1, and the descriptions regarding the other operations of the data verification method 700 will be omitted herein for the sake of brevity.

In step 740, outputting the first maximum voltage value.

Please refer to FIG. 1 to FIG. 5, the processor 110 can output the first maximum voltage value. For example, the operations of the data verification method 700 are similar to the operations of the data verification device 100 of FIG. 1, and the descriptions regarding the other operations of the data verification method 700 will be omitted herein for the sake of brevity.

Please refer to FIG. 1 to FIG. 5, in some embodiments, the first high frequency sequence data comprise the first sub data having the first logic value of 0101. The second high frequency sequence data comprise the second sub data having the second logic value of 1010. For example, the operations of the data verification method 700 are similar to the operations of the data verification device 100 of FIG. 1, and the descriptions regarding the other operations of the data verification method 700 will be omitted herein for the sake of brevity.

In some embodiments, the data verification method 700 further includes the following steps: writing the first low frequency sequence data to the memory 900 to obtain the third voltage value. For example, the operations of the data verification method 700 are similar to the operations of the data verification device 100 of FIG. 1, and the descriptions regarding the other operations of the data verification method 700 will be omitted herein for the sake of brevity.

In some embodiments, the data verification method 700 further includes the following steps: writing the second low frequency sequence data to the memory to obtain the fourth voltage value. For example, the operations of the data verification method 700 are similar to the operations of the data verification device 100 of FIG. 1, and the descriptions regarding the other operations of the data verification method 700 will be omitted herein for the sake of brevity.

In some embodiments, the data verification method 700 further includes the following steps: comparing the third voltage value and the fourth voltage value to obtain the second maximum voltage value. For example, the operations of the data verification method 700 are similar to the operations of the data verification device 100 of FIG. 1, and the descriptions regarding the other operations of the data verification method 700 will be omitted herein for the sake of brevity.

In some embodiments, the data verification method 700 further includes the following steps: outputting the second maximum voltage value. For example, the operations of the data verification method 700 are similar to the operations of the data verification device 100 of FIG. 1, and the descriptions regarding the other operations of the data verification method 700 will be omitted herein for the sake of brevity.

In some embodiments, the first low frequency sequence data comprise the third sub data having the third logic value of 0111. For example, the operations of the data verification method 700 are similar to the operations of the data verification device 100 of FIG. 1, and the descriptions regarding the other operations of the data verification method 700 will be omitted herein for the sake of brevity.

In some embodiments, the second low frequency sequence data comprises the fourth sub data having the fourth logic value of 0001. For example, the operations of the data verification method 700 are similar to the operations of the data verification device 100 of FIG. 1, and the descriptions regarding the other operations of the data verification method 700 will be omitted herein for the sake of brevity.

In some embodiments, the first sequence number of the first high frequency sequence data is 16. For example, the operations of the data verification method 700 are similar to the operations of the data verification device 100 of FIG. 1, and the descriptions regarding the other operations of the data verification method 700 will be omitted herein for the sake of brevity.

In some embodiments, the second sequence number of the first high frequency sequence data is 16. For example, the operations of the data verification method 700 are similar to the operations of the data verification device 100 of FIG. 1, and the descriptions regarding the other operations of the data verification method 700 will be omitted herein for the sake of brevity.

In some embodiments, DFE is used to compensate the write data performance especial DQ input high performance. In some embodiments, giving high frequency topo can distinguish DFE compensate strength and trend. In some embodiments, giving low frequency topo can distinguish DFE compensate strength and trend. In some embodiments, combination high frequency topo and low frequency topo can distinguish DFE compensate strength and trend.

It can be seen from the above embodiments of the present disclosure that the application of the present disclosure has the following advantages. The data verification device 100 and the data verification method 700 shown in the embodiment of the present disclosure can offer the high frequency topo and low frequency topo, so as to achieve distinguishing DFE compensate strength and trend.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A data verification device, comprising:
a processor, configured to perform following steps:
writing a first high frequency sequence data to a memory to obtain a first voltage value;
writing a second high frequency sequence data to the memory to obtain a second voltage value;
comparing the first voltage value and the second voltage value to obtain a first maximum voltage value; and
outputting the first maximum voltage value;
wherein the first high frequency sequence data comprises a first sub data having a first logic value of 0101;
wherein the second high frequency sequence data comprises a second sub data having a second logic value of 1010, and the processor further performs the following steps:
writing a first low frequency sequence data to the memory to obtain a third voltage value.

2. The data verification device of claim 1, wherein the processor further performs the following steps:
writing a second low frequency sequence data to the memory to obtain a fourth voltage value.

3. The data verification device of claim 2, wherein the processor further performs the following steps:
comparing the third voltage value and the fourth voltage value to obtain a second maximum voltage value.

4. The data verification device of claim 3, wherein the processor further performs the following steps:
outputting the second maximum voltage value.

5. The data verification device of claim 4, wherein the first low frequency sequence data comprises a third sub data having a third logic value of 0111.

6. The data verification device of claim 5, wherein the second low frequency sequence data comprises a fourth sub data having a fourth logic value of 0001.

7. The data verification device of claim 1, wherein a first sequence number of the first high frequency sequence data is 16.

8. The data verification device of claim 1, wherein a second sequence number of the first high frequency sequence data is 16.

9. A data verification method, comprising:
writing a first high frequency sequence data to a memory to obtain a first voltage value, wherein the first high frequency sequence data comprises a first sub data having a first logic value of 0101;
writing a second high frequency sequence data to the memory to obtain a second voltage value, wherein the second high frequency sequence data comprises a second sub data having a second logic value of 1010;
comparing the first voltage value and the second voltage value to obtain a first maximum voltage value;
outputting the first maximum voltage value; and
writing a first low frequency sequence data to the memory to obtain a third voltage value.

10. The data verification method of claim 9, further comprising:
writing a second low frequency sequence data to the memory to obtain a fourth voltage value.

11. The data verification method of claim 10, further comprising:
comparing the third voltage value and the fourth voltage value to obtain a second maximum voltage value.

12. The data verification method of claim 11, further comprising:
outputting the second maximum voltage value.

13. The data verification method of claim 12, wherein the first low frequency sequence data comprises a third sub data having a third logic value of 0111.

14. The data verification method of claim 13, wherein the second low frequency sequence data comprises a fourth sub data having a fourth logic value of 0001.

15. The data verification method of claim 9, wherein a first sequence number of the first high frequency sequence data is 16.

16. The data verification method of claim 9, wherein a second sequence number of the first high frequency sequence data is 16.

\* \* \* \* \*